United States Patent
Horie et al.

[19]

[11] Patent Number: 6,054,876
[45] Date of Patent: Apr. 25, 2000

[54] BUFFER CIRCUIT

[75] Inventors: Masakiyo Horie, Gamagoori; Hirofumi Isomura; Takuya Harada, both of Kariya, all of Japan

[73] Assignee: Denso Corporation, Kariya, Japan

[21] Appl. No.: 09/118,072

[22] Filed: Jul. 17, 1998

[30]   Foreign Application Priority Data

Jul. 18, 1997  [JP]  Japan .................................... 9-194633

[51] Int. Cl.⁷ .................. H03K 19/0175; H03K 19/094; H03K 19/003; H03K 17/687
[52] U.S. Cl. .............................. 326/83; 326/112; 326/23; 326/27; 327/437
[58] Field of Search .............................. 326/83, 86, 112, 326/121, 119, 22, 23, 26, 27; 327/206, 437

[56]          References Cited

U.S. PATENT DOCUMENTS

| | | | |
|---|---|---|---|
| 4,719,369 | 1/1988 | Asano et al. | 326/30 |
| 5,087,834 | 2/1992 | Tsay | 326/33 |
| 5,166,558 | 11/1992 | Ohsawa | 326/71 |
| 5,166,635 | 11/1992 | Shih | 330/253 |
| 5,361,041 | 11/1994 | Lish | 330/255 |
| 5,977,796 | 11/1999 | Gabara | 326/86 |

FOREIGN PATENT DOCUMENTS

| | | |
|---|---|---|
| 61-295709 A | 12/1966 | Japan . |
| 5-129848 | 5/1993 | Japan . |
| 8-204468A | 8/1996 | Japan . |

*Primary Examiner*—Michael Tokar
*Assistant Examiner*—James H. Cho
*Attorney, Agent, or Firm*—Pillsbury Madison & Sutro LLP

[57]         ABSTRACT

A buffer circuit includes a signal input terminal and a signal output terminal. A first operational amplifier includes a differential amplifier circuit having an input transistor of an N-channel MOS type. The first operational amplifier has an inverting input terminal and an output terminal connected to each other. The first operational amplifier has a non-inverting input terminal connected to the signal input terminal. A second operational amplifier includes a differential amplifier circuit having an input transistor of a P-channel MOS type. The second operational amplifier has an inverting input terminal and an output terminal connected to each other. The second operational amplifier has a non-inverting input terminal connected to the signal input terminal. A first switching device operates for connecting the output terminal of the first operational amplifier to the signal output terminal when a voltage of an input signal applied to the signal input terminal is in a range where the first operational amplifier is operative. A second switching device operates for connecting the output terminal of the second operational amplifier to the signal output terminal when the voltage of the input signal applied to the signal input terminal is in a range where the second operational amplifier is operative.

6 Claims, 6 Drawing Sheets

BUFFER CIRCUIT

BACKGROUND OF THE INVENTION

1. Field of the Invention

This invention generally relates to a buffer circuit. This invention particularly relates to a buffer circuit which generates a rail-to-rail output signal in response to an input dc voltage.

2. Description of the Related Art

Japanese published unexamined patent application 61-295709 discloses an operational amplifier having a first differential amplifier portion, a second differential amplifier portion, a level shift means, and a final amplifier portion. In the operational amplifier of Japanese application 61-295709, the first differential amplifier portion uses an N-channel MOS FET as an input transistor while the second differential amplifier portion uses a P-channel MOS FET as an input transistor. The level shift means receives the output signal of one of the first and second differential amplifier portions, and shifts the level of the received signal. The resultant output signal of the level shift means and the output signal of the other of the first and second differential amplifier portions are fed to the final amplifier portion.

Japanese published unexamined patent application 5-129848 discloses an offset voltage compensating circuit for a differential amplifier. The circuit of Japanese application 5-129848 includes a short-circuiting switch SW1 to set input terminals of a differential amplifier at the same voltage, capacitors C1 and C2 connected to a node to change the output voltage of the differential amplifier, and charge/discharge switches SW3–SW6 to connect the capacitors C1 and C2 to a charging source or a discharging source. Also, the circuit of Japanese application 5-129848 includes a comparator and a switch control circuit. The comparator operates to compare an output voltage from the differential amplifier with a prescribed reference voltage. The switch control circuit operates the short-circuiting switch SW1 when receiving a compensation starting signal. The switch control circuit operates the charge/discharge switches SW3–SW6 in response to an output signal of the comparator so that the output voltage of the differential amplifier can be coincident with the prescribed reference voltage.

Japanese published unexamined patent application 8-204468 discloses an operational amplifier including first and second differential amplifier circuits subjected to a common input voltage. In the operational amplifier of Japanese application 8-204468, the first differential amplifier circuit can operate when the input voltage is higher than a first voltage range within a fixed voltage range measured from a lower-side power supply voltage. The second differential amplifier circuit can operate when the input voltage is lower than a second voltage range within a fixed voltage range measured from a higher-side power supply voltage. A top of the first differential amplifier circuit has an N-channel transistor while a top of the second differential amplifier circuit has a P-channel transistor. In the operational amplifier of Japanese application 8-204468, the first differential amplifier circuit is provided with first offset trimmer circuits for adjusting the offset thereof when the input voltage is in the second voltage range. The second differential amplifier circuit is provided with second offset trimmer circuits for adjusting the offset thereof when the input voltage is in the first voltage range.

In general, a buffer circuit using an operational amplifier tends to have a problem of an offset voltage.

SUMMARY OF THE INVENTION

It is an object of this invention to provide an improved buffer circuit.

A first aspect of this invention provides a buffer circuit comprising a signal input terminal; a signal output terminal; a first operational amplifier including a differential amplifier circuit having an input transistor of an N-channel MOS type, the first operational amplifier having an inverting input terminal and an output terminal connected to each other, the first operational amplifier having a non-inverting input terminal connected to the signal input terminal; a second operational amplifier including a differential amplifier circuit having an input transistor of a P-channel MOS type, the second operational amplifier having an inverting input terminal and an output terminal connected to each other, the second operational amplifier having a non-inverting input terminal connected to the signal input terminal; first switching means for connecting the output terminal of the first operational amplifier to the signal output terminal when a voltage of an input signal applied to the signal input terminal is in a range where the first operational amplifier is operative; and second switching means for connecting the output terminal of the second operational amplifier to the signal output terminal when the voltage of the input signal applied to the signal input terminal is in a range where the second operational amplifier is operative.

A second aspect of this invention is based on the first aspect thereof, and provides a buffer circuit wherein the first switching means comprises a first output transistor having a first output terminal connected to the output terminal of the first operational amplifier, and a second output terminal connected to the signal output terminal; and first drive means for setting the first output transistor in its on state when the voltage of the input signal applied to the signal input terminal is in the range where the first operational amplifier is operative; and wherein the second switching means comprises a second output transistor having a first output terminal connected to the output terminal of the second operational amplifier, and a second output terminal connected to the signal output terminal; and second drive means for setting the second output transistor in its on state when the voltage of the input signal applied to the signal input terminal is in the range where the second operational amplifier is operative.

A third aspect of this invention is based on the second aspect thereof, and provides a buffer circuit wherein the first output transistor comprises a P-channel MOS transistor having a source connected to the output terminal of the first operational amplifier, and a drain connected to the signal output terminal; wherein the second output transistor comprises an N-channel MOS transistor having a source connected to the output terminal of the second operational amplifier, and a drain connected to the signal output terminal; wherein the first drive means comprises an N-channel MOS transistor having a gate connected to the output terminal of the second operational amplifier or the signal input terminal, a source connected to a lower voltage side of a dc voltage, and a drain connected to a gate of the first output transistor; and a first load resistor connected between the drain of the N-channel MOS transistor in the first drive means and a higher voltage side of the dc voltage; and wherein the second drive means comprises a P-channel MOS transistor having a gate connected to the output terminal of the first operational amplifier or the signal input terminal, a source connected to the higher voltage side of the dc voltage, and a drain connected to a gate of the second output transistor; and a second load resistor connected between the drain of the P-channel MOS transistor in the second drive means and the lower voltage side of the dc voltage.

A fourth aspect of this invention is based on the first aspect thereof, and provides a buffer circuit further comprising first adjusting means provided in the differential amplifier circuit in the first operational amplifier for adjusting an output voltage of the first operational amplifier in response to a first control voltage; second adjusting means provided in the differential amplifier circuit in the second operational amplifier for adjusting an output voltage of the second operational amplifier in response to a second control voltage; reference voltage applying means for applying a prescribed reference voltage to the non-inverting input terminal of the first operational amplifier and the non-inverting input terminal of the second operational amplifier; and offset correcting means for, in cases where the reference voltage applying means continues to apply the prescribed reference voltage to the non-inverting input terminal of the first operational amplifier and the non-inverting input terminal of the second operational amplifier, 1) varying the first control voltage to the first adjusting means, 2) stopping varying the first control voltage when the output voltage of the first operational amplifier becomes equal to the prescribed reference voltage, 3) varying the second control voltage to the second operational amplifier, and 4) stopping varying the second control voltage when the output voltage of the second operational amplifier becomes equal to the prescribed reference voltage.

A fifth aspect of this invention is based on the first aspect thereof, and provides a buffer circuit wherein the first switching means comprises a first output transistor having a first output terminal connected to the output terminal of the first operational amplifier, and a second output terminal connected to the signal output terminal; wherein the second switching means comprises a second output transistor having a first output terminal connected to the output terminal of the second operational amplifier, and a second output terminal connected to the signal output terminal; and wherein threshold voltages of the first and second output transistors are different from threshold voltages of transistors in the first and second operational amplifiers.

A sixth aspect of this invention is based on the first aspect thereof, and provides a buffer circuit wherein the first switching means comprises a P-channel MOS transistor having a source connected to the output terminal of the first operational amplifier, a drain connected to the signal output terminal, and a gate subjected to a first fixed potential; and wherein the second switching means comprises an N-channel MOS transistor having a source connected to the output terminal of the second operational amplifier, a drain connected to the signal output terminal, and a gate subjected to a second fixed potential different from the first fixed potential.

DESCRIPTION OF THE PREFERRED EMBODIMENTS

First Embodiment

Figure 1:
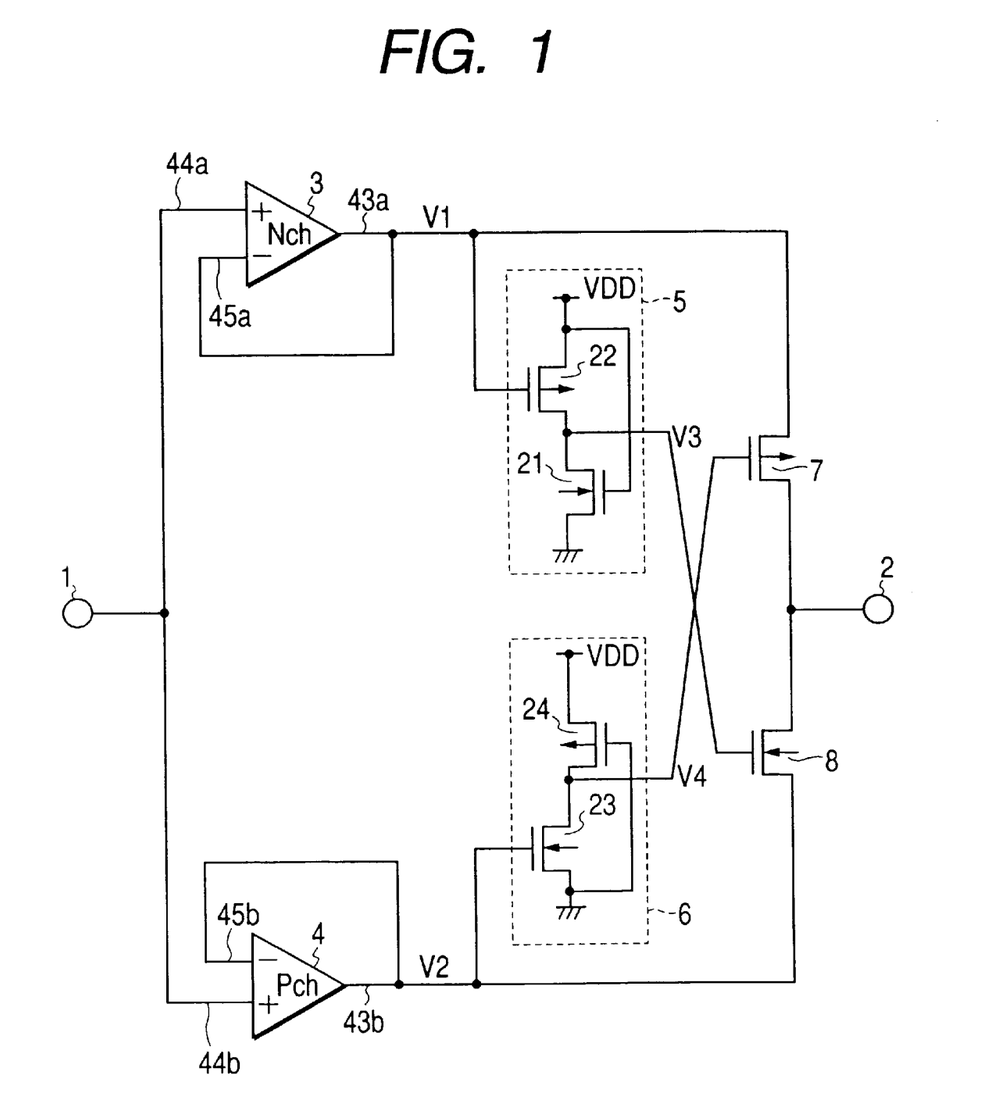
FIG. 1 is a diagram of a buffer circuit according to a first embodiment of this invention.

FIG. 1 shows a buffer circuit according to a first embodiment of this invention. The buffer circuit of FIG. 1 is activated by a dc power supply voltage. The buffer circuit of FIG. 1 has a signal input terminal 1 and a signal output terminal 2. An input signal (a voltage signal) can travel from the signal input terminal 1 to the signal output terminal 2 through the body portion of the buffer circuit.

The dc power supply voltage fed to the buffer circuit is defined between a lower side VSS equal to 0 V (a ground potential or a ground voltage GND) and a higher side VDD equal to +5 V. The higher side VDD is also referred to as the positive power supply voltage VDD. The lower side VSS may be different from 0 V. The higher side VDD may be different from +5 V.

As shown in FIG. 1, the buffer circuit includes operational amplifiers 3 and 4. The operational amplifier 3 has a differential amplifier circuit in which input transistors use N-channel MOS transistors. The operational amplifier 4 has a differential amplifier circuit in which input transistors use P-channel MOS transistors.

The inverting input terminal 45a and the output terminal 43a of the operational amplifier 3 are connected to each other so that the operational amplifier 3 forms a buffer amplifier. Similarly, the inverting input terminal 45b and the output terminal 43b of the operational amplifier 4 are connected to each other so that the operational amplifier 4 forms a buffer amplifier. The non-inverting input terminal 44a of the operational amplifier 3 and the non-inverting input terminal 44b of the operational amplifier 4 are connected in common to the signal input terminal 1 of the buffer circuit.

As shown in FIG. 1, the buffer circuit includes drive circuits 5 and 6, a P-channel MOS transistor 7, and an N-channel MOS transistor 8. The source of the P-channel MOS transistor 7 is connected to the output terminal 43a of the operational amplifier 3. The drain of the P-channel MOS transistor 7 is connected to the signal output terminal 2 of the buffer circuit. The drive circuit 6 is connected to the gate of the P-channel MOS transistor 7. The drive circuit 6 operates to selectively turn on and off the P-channel MOS transistor 7. The source of the N-channel MOS transistor 8 is connected to the output terminal 43b of the operational amplifier 4. The drain of the N-channel MOS transistor 8 is connected to the signal output terminal 2 of the buffer circuit. The drive circuit 5 is connected to the gate of the N-channel MOS transistor 8. The drive circuit 5 operates to selectively turn on and off the N-channel MOS transistor 8.

The drive circuit 6 includes an N-channel MOS transistor 23 and a P-channel MOS transistor 24. The gate of the N-channel MOS transistor 23 is connected to the output terminal 43b of the operational amplifier 4. The source of the N-channel MOS transistor 23 is connected to a ground line, being subjected to the ground voltage GND (0 V). The drain of the N-channel MOS transistor 23 is connected to the gate of the P-channel MOS transistor 7. The gate of the P-channel MOS transistor 24 is connected to the ground line, being subjected to the ground voltage GND (0 V). The source of the P-channel MOS transistor 24 is connected to a positive power supply line, being subjected to the positive power supply voltage VDD (+5 V). The drain of the P-channel MOS transistor 24 is connected to the drain of the N-channel MOS transistor 23. Since the gate of the P-channel MOS transistor 24 remains subjected to the ground voltage GND (0 V), the P-channel MOS transistor 24 continues to be in an on state or a conductive state. The P-channel MOS transistor 24 serves as a pull-up load resistor connected between the positive power supply line and the drain of the N-channel MOS transistor 23.

The drive circuit 5 includes an N-channel MOS transistor 21 and a P-channel MOS transistor 22. The gate of the P-channel MOS transistor 22 is connected to the output terminal 43a of the operational amplifier 3. The source of the P-channel MOS transistor 22 is connected to the positive power supply line, being subjected to the positive power supply voltage VDD (+5 V). The drain of the P-channel MOS transistor 22 is connected to the gate of the N-channel MOS transistor 8. The gate of the N-channel MOS transistor 21 is connected to the positive power supply line, being subjected to the positive power supply voltage VDD (+5 V). The source of the N-channel MOS transistor 21 is connected to the ground line, being subjected to the ground voltage GND (0 V). The drain of the N-channel MOS transistor 21 is connected to the drain of the P-channel MOS transistor 22. Since the gate of the N-channel MOS transistor 21 remains subjected to the positive power supply voltage VDD (+5 V), the N-channel MOS transistor 21 continues to be in an on state or a conductive state. The N-channel MOS transistor 21 serves as a pull-down load resistor connected between the ground line and the drain of the P-channel MOS transistor 22.

Figure 2:
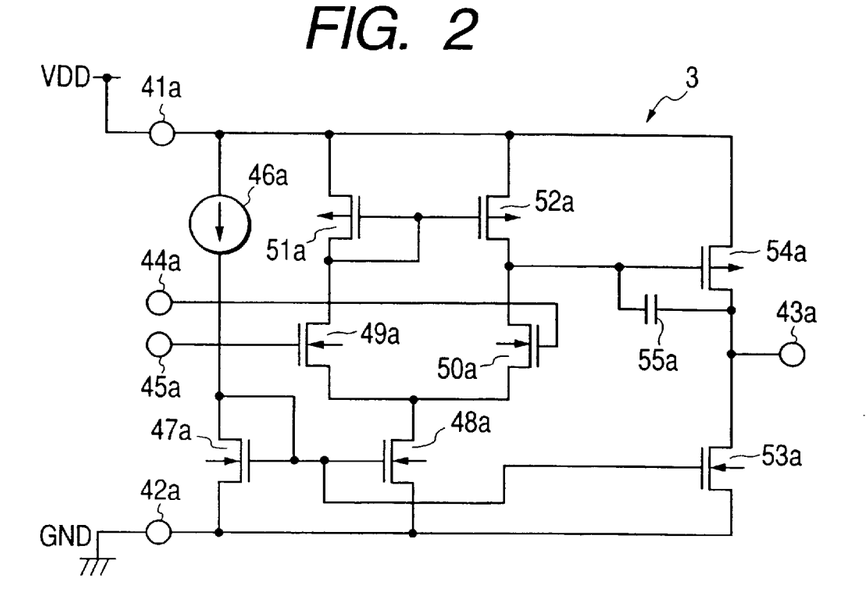
FIG. 2 is a schematic diagram of a first operational amplifier in FIG. 1.

The operational amplifier 3 has a typical structure made by a CMOS processing technology. As shown in FIG. 2, the operational amplifier 3 has a pair of power supply terminals 41a and 42a. The power supply terminal 41a is connected to the positive power supply line, being subjected to the positive power supply voltage VDD (+5 V). The power supply terminal 42a is connected to the ground line, being subjected to the ground voltage GND (0 V).

As shown in FIG. 2, the operational amplifier 3 includes a constant current source 46a, N-channel MOS transistors 47a, 48a, 49a, and 50a, P-channel MOS transistors 51a and 52a, an N-channel MOS transistor 53a, a P-channel MOS transistor 54a, and a phase compensation capacitor 55a.

A first end of the constant current source 46a is connected to the positive power supply line via the power supply terminal 41a, being subjected to the positive power supply voltage VDD. The drain of the N-channel MOS transistor 47a is connected to a second end of the constant current source 46a. Also, the drain of the N-channel MOS transistor 47a is connected to the gate thereof. The source of the N-channel MOS transistor 47a is connected to the ground line via the power supply terminal 42a, being subjected to the ground voltage GND. The source of the N-channel MOS transistor 48a is connected to the ground line via the power supply terminal 42a, being subjected to the ground voltage GND. The gate of the N-channel MOS transistor 48a is connected to the gate of the N-channel MOS transistor 47a. The N-channel MOS transistors 47a and 48a compose a current mirror circuit. The sources of the N-channel MOS transistors 49a and 50a are connected in common to the drain of the N-channel MOS transistor 48a. The drain of the P-channel MOS transistor 51a is connected to the gate thereof. Also, the drain of the P-channel MOS transistor 51a is connected to the drain of the N-channel MOS transistor 49a. The source of the P-channel MOS transistor 51a is connected to the positive power supply line via the power supply terminal 41a, being subjected to the positive power supply voltage VDD. The drain of the P-channel MOS transistor 52a is connected to the drain of the N-channel MOS transistor 50a. The source of the P-channel MOS transistor 52a is connected to the positive power supply line via the power supply terminal 41a, being subjected to the positive power supply voltage VDD. The gate of the P-channel MOS transistor 52a is connected to the gate of the P-channel MOS transistor 51a. The P-channel MOS transistors 51a and 52a compose a current mirror circuit. The source of the N-channel MOS transistor 53a is connected to the ground line via the power supply terminal 42a, being subjected to the ground voltage GND. The gate of the N-channel MOS transistor 53a is connected to the gate of the N-channel MOS transistor 47a. The N-channel MOS transistors 47a and 53a compose a current mirror circuit. The drain of the P-channel MOS transistor 54a is connected to the drain of the N-channel MOS transistor 53a. The gate of the P-channel MOS transistor 54a is connected to the drain of the N-channel MOS transistor 50a. The source of the P-channel MOS transistor 54a is connected to the positive power supply line via the power supply terminal 41a, being subjected to the positive power supply voltage VDD. The phase compensation capacitor 55a is connected between the gate and the drain of the P-channel MOS transistor 54a.

In the operational amplifier 3, the N-channel MOS transistors 48a, 49a, and 50a, and the P-channel MOS transistors 51a and 52a compose a differential amplifier circuit. The N-channel MOS transistors 49a and 50a are input transistors of the differential amplifier circuit. The gate of the N-channel MOS transistor 49a is connected to the inverting input terminal 45a of the operational amplifier 3. The gate of the N-channel MOS transistor 50a is connected to the non-inverting input terminal 44a of the operational amplifier 3. The P-channel MOS transistors 51a and 52a are load transistors with respect to the input transistors which are formed by the N-channel MOS transistors 49a and 50a. The N-channel MOS transistor 48a serves as a constant current transistor for making constant the sum of currents flowing through the N-channel MOS transistors 49a and 50a.

In the operational amplifier 3, the N-channel MOS transistor 53a, the P-channel MOS transistor 54a, and the phase compensation capacitor 55a compose an output amplifier circuit. The drains of the N-channel MOS transistor 53a and the P-channel MOS transistor 54a are connected in common to the output terminal 43a of the operational amplifier 3. The constant current source 46a and the N-channel MOS transistor 47a compose a bias circuit for determining constant currents flowing through the N-channel MOS transistors 48a and 53a.

In the operational amplifier 3, the difference between a current flowing through the N-channel MOS transistor 49a and a current flowing through the N-channel MOS transistor 50a varies in accordance with the difference between voltages applied to the non-inverting input terminal 44a and the inverting input terminal 45a. An output voltage which appears at the output terminal 43a depends on the difference between the currents flowing through the N-channel MOS transistors 49a and 50a. Thus, the output voltage varies in accordance with the difference between the voltages applied to the non-inverting input terminal 44a and the inverting input terminal 45a.

Figure 3:
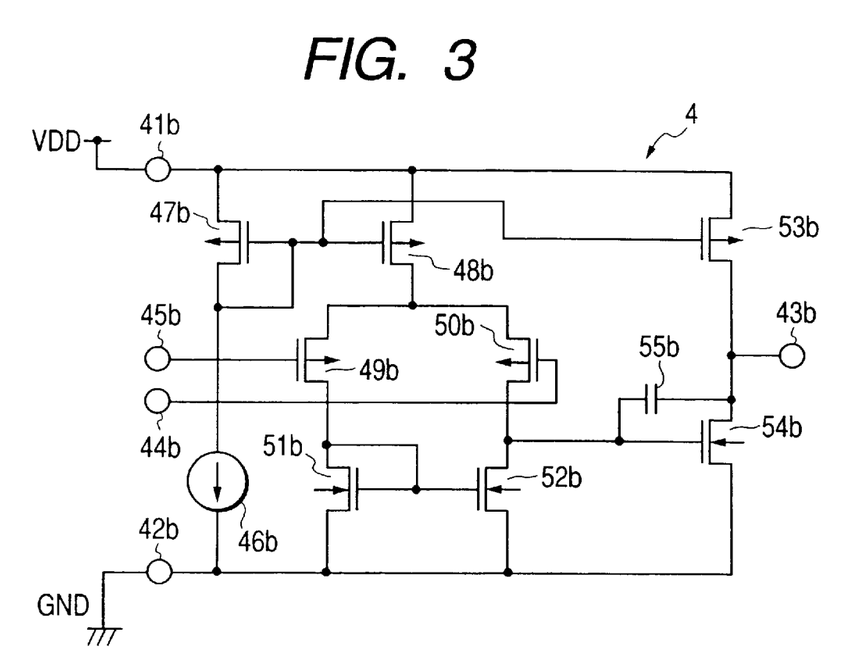
FIG. 3 is a schematic diagram of a second operational amplifier in FIG. 1.

The operational amplifier 4 has a typical structure made by a CMOS processing technology. As shown in FIG. 3, the operational amplifier 4 has a pair of power supply terminals 41b and 42b. The power supply terminal 41b is connected to the positive power supply line, being subjected to the positive power supply voltage VDD (+5 V). The power supply terminal 42b is connected to the ground line, being subjected to the ground voltage GND (0 V).

As shown in FIG. 3, the operational amplifier 4 includes a constant current source 46b, P-channel MOS transistors 47b, 48b, 49b, and 50b, N-channel MOS transistors 51b and 52b, a P-channel MOS transistor 53b, an N-channel MOS transistor 54b, and a phase compensation capacitor 55b.

A first end of the constant current source 46b is connected to the ground line via the power supply terminal 42b, being subjected to the ground voltage GND. The drain of the P-channel MOS transistor 47b is connected to a second end of the constant current source 46b. Also, the drain of the P-channel MOS transistor 47b is connected to the gate thereof. The source of the P-channel MOS transistor 47b is connected to the positive power supply line via the power supply terminal 41b, being subjected to the positive power supply voltage VDD. The source of the P-channel MOS transistor 48b is connected to the positive power supply line via the power supply terminal 41b, being subjected to the positive power supply voltage VDD. The gate of the P-channel MOS transistor 48b is connected to the gate of the P-channel MOS transistor 47b. The P-channel MOS transistors 47b and 48b compose a current mirror circuit. The sources of the P-channel MOS transistors 49b and 50b are connected in common to the drain of the P-channel MOS transistor 48b. The drain of the N-channel MOS transistor 51b is connected to the gate thereof. Also, the drain of the N-channel MOS transistor 51b is connected to the drain of the P-channel MOS transistor 49b. The source of the N-channel MOS transistor 51b is connected to the ground line via the power supply terminal 42b, being subjected to the ground voltage GND. The drain of the N-channel MOS transistor 52b is connected to the drain of the P-channel MOS transistor 50b. The source of the N-channel MOS transistor 52b is connected to the ground line via the power supply terminal 42b, being subjected to the ground voltage GND. The gate of the N-channel MOS transistor 52b is connected to the gate of the N-channel MOS transistor 51b. The N-channel MOS transistors 51b and 52b compose a current mirror circuit. The source of the P-channel MOS transistor 53b is connected to the positive power supply line via the power supply terminal 41b, being subjected to the positive power supply voltage VDD. The gate of the P-channel MOS transistor 53b is connected to the gate of the P-channel MOS transistor 47b. The P-channel MOS transistors 47b and 53b compose a current mirror circuit. The drain of the N-channel MOS transistor 54b is connected to the drain of the P-channel MOS transistor 53b. The gate of the N-channel MOS transistor 54b is connected to the drain of the P-channel MOS transistor 50b. The source of the N-channel MOS transistor 54b is connected to the ground line via the power supply terminal 42b, being subjected to the ground voltage GND. The phase compensation capacitor 55b is connected between the gate and the drain of the N-channel MOS transistor 54b.

In the operational amplifier 4, the P-channel MOS transistors 48b, 49b, and 50b, and the N-channel MOS transistors 51b and 52b compose a differential amplifier circuit. The P-channel MOS transistors 49b and 50b are input transistors of the differential amplifier circuit. The gate of the P-channel MOS transistor 49b is connected to the inverting input terminal 45b of the operational amplifier 4. The gate of the P-channel MOS transistor 50b is connected to the non-inverting input terminal 44b of the operational amplifier 3. The N-channel MOS transistors 51b and 52b are load transistors with respect to the input transistors which are formed by the P-channel MOS transistors 49b and 50b. The P-channel MOS transistor 48b serves as a constant current transistor for malking constant the sum of currents flowing through the P-channel MOS transistors 49b and 50b.

In the operational amplifier 4, the P-channel MOS transistor 53b, the N-channel MOS transistor 54b, and the phase compensation capacitor 55b compose an output amplifier circuit. The drains of the P-channel MOS transistor 53b and the N-channel MOS transistor 54b are connected in common to the output terminal 43b of the operational amplifier 4. The constant current source 46b and the P-channel MOS transistor 47b compose a bias circuit for determining constant currents flowing through the P-channel MOS transistors 48b and 53b.

In the operational amplifier 4, the difference between a current flowing through the P-channel MOS transistor 49b and a current flowing through the P-channel MOS transistor 50b varies in accordance with the difference between voltages applied to the non-inverting input terminal 44b and the inverting input terminal 45b. An output voltage which appears at the output terminal 43b depends on the difference between the currents flowing through the P-channel MOS transistors 49b and 50b. Thus, the output voltage varies in accordance with the difference between the voltages applied to the non-inverting input terminal 44b and the inverting input terminal 45b.

The buffer circuit of FIG. 1 operates as follows. Since the output terminal 43a and the inverting input terminal 45a of the operational amplifier 3 are connected to each other, a voltage which appears at the output terminal 43a of the operational amplifier 3 is basically equal to a voltage applied to the non-inverting input terminal 44a thereof (that is, the voltage of an input signal fed via the signal input terminal 1).

As shown in FIG. 2, in the operational amplifier 3, the N-channel MOS transistors 49a and 50a are input transistors of a differential amplifier circuit. The sources of the N-channel MOS transistors 49a and 50a are connected in common to the drain of the N-channel MOS transistor 48a. The N-channel MOS transistor 48a serves as a constant current source for determining currents flowing through the N-channel MOS transistors 49a and 50a. Accordingly, the operational amplifier 3 can normally respond to an input voltage which is in the range from about a given threshold voltage VTHN to the positive power supply voltage VDD. The given threshold voltage VTHN relates to the N-channel MOS transistors 49a and 50a.

When a common-mode input voltage applied to the input terminals 44a and 45a drops to about the given threshold voltage VTHN, the N-channel MOS transistors 49a and 50a (the input transistors) fall into their off states. In this case, the voltage at the drain of the N-channel MOS transistor 48a drops to about 0 V (the ground voltage GND). The change of the N-channel MOS transistors 49a and 50a to their off states moves the operational amplifier 3 into an inoperative state.

Since the output terminal 43b and the inverting input terminal 45b of the operational amplifier 4 are connected to each other, a voltage which appears at the output terminal 43b of the operational amplifier 4 is basically equal to a voltage applied to the non-inverting input terminal 44b thereof (that is, the voltage of an input signal fed via the signal input terminal 1).

As shown in FIG. 3, in the operational amplifier 4, the P-channel MOS transistors 49b and 50b are input transistors of a differential amplifier circuit. The sources of the P-channel MOS transistors 49b and 50b are connected in common to the drain of the P-channel MOS transistor 48b. The P-channel MOS transistor 48b serves as a constant current source for determining currents flowing through the P-channel MOS transistors 49b and 50b. Accordingly, the operational amplifier 4 can normally respond to an input voltage which is in the range from 0 V (the ground voltage GND) to about a given threshold voltage VDD−VTHP. The given threshold voltage VDD−VTHP is lower than the positive power supply voltage VDD by a given level VTHP. The given level VTHP corresponds to a given threshold voltage related to the P-channel MOS transistors 49b and 50b.

When a common-mode input voltage applied to the input terminals 44b and 45b rises to about the given threshold voltage VDD−VTHP, the P-channel MOS transistors 49b and 50b (the input transistors) fall into their off states. In this case, the voltage at the drain of the P-channel MOS transistor 48b rises to about the positive power supply voltage VDD. The change of the P-channel MOS transistors 49b and 50b to their off states moves the operational amplifier 4 into an inoperative state.

In the drive circuit 6, the P-channel MOS transistor 24 remains in its on state. The P-channel MOS transistor 24 serves as a pull-up load resistor connected between the positive power supply line and the drain of the N-channel MOS transistor 23. The N-channel MOS transistor 23 is in its off state when a voltage V2 at the gate thereof is in the range from 0 V to the given threshold voltage VTHN. The N-channel MOS transistor 23 is in its on state when the gate voltage V2 is outside the previously-indicated range.

Figure 4:
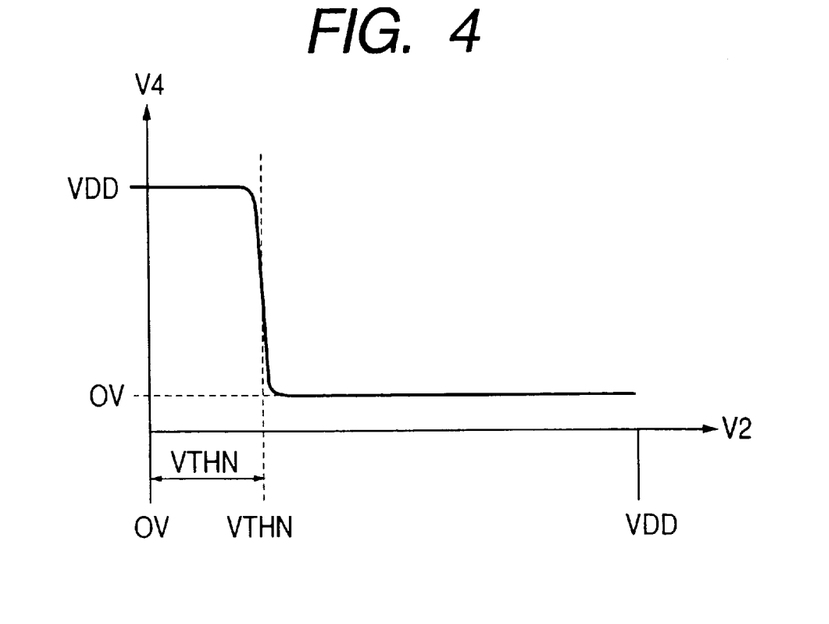
FIG. 4 is a diagram of the relation between an output voltage V2 of the second operational amplifier and a drain voltage V4 of an N-channel MOS transistor in FIG. 1.

As shown in FIG. 4, a voltage V4 at the drain of the N-channel MOS transistor 23 is equal to about the positive power supply voltage VDD when the gate voltage V2 of the N-channel MOS transistor 23 is in the range from 0 V to the given threshold voltage VTHN. The drain voltage V4 of the N-channel MOS transistor 23 is equal to about 0 V when the gate voltage V2 of the N-channel MOS transistor 23 is in the range from the given threshold voltage VTHN to the positive power supply voltage VDD. It should be noted that the gate voltage V2 of the N-channel MOS transistor 23 is equal to the output voltage of the operational amplifier 4. In addition, the drain voltage V4 of the N-channel MOS transistor 23 is equal to the gate voltage of the P-channel MOS transistor 7.

In the drive circuit 5, the N-channel MOS transistor 21 remains in its on state. The N-channel MOS transistor 21 serves as a pull-down load resistor connected between the ground line and the drain of the P-channel MOS transistor 22. The P-channel MOS transistor 22 is in its off state when a voltage V1 at the gate thereof is in the range from the given threshold voltage VDD−VTHP to the positive power supply voltage VDD. The P-channel MOS transistor 22 is in its on state when the gate voltage V1 is outside the previously-indicated range.

Figure 5:
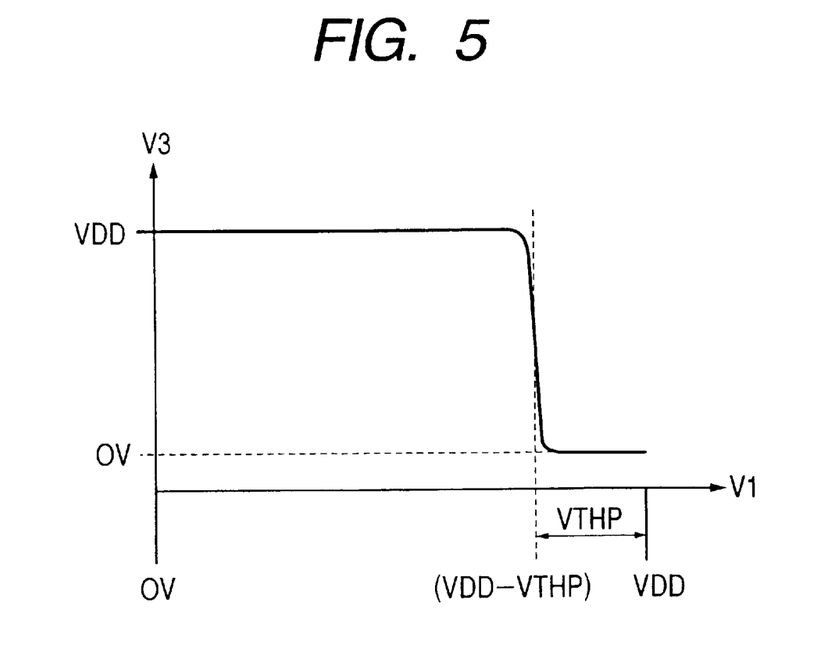
FIG. 5 is a diagram of the relation between an output voltage V1 of the first operational amplifier and a drain voltage V3 of a P-channel MOS transistor in FIG. 1.

As shown in FIG. 5, a voltage V3 at the drain of the P-channel MOS transistor 22 is equal to about the positive power supply voltage VDD when the gate voltage V1 of the P-channel MOS transistor 22 is in the range from 0 V to the given threshold voltage VDD−VTHP. The drain voltage v3 of the P-channel MOS transistor 22 is equal to about 0 V when the gate voltage V1 of the P-channel MOS transistor 22 is in the range from the given threshold voltage VDD−VTHP to the positive power supply voltage VDD. It should be noted that the gate voltage V1 of the P-channel MOS transistor 22 is equal to the output voltage of the operational amplifier 3. In addition, the drain voltage V3 of the P-channel MOS transistor 22 is equal to the gate voltage of the N-channel MOS transistor 8.

When the voltage of the input signal applied to the signal input terminal 1 is in the range from 0 V to the given threshold voltage VTHN, the operational amplifier 4 normally operates and the operational amplifier 3 remains inoperative. In this case, the output voltage V1 of the operational amplifier 3 is equal to about the given threshold voltage VTHN while the output voltage V2 of the operational amplifier 4 is equal to the voltage of the input signal. Thus, as shown in FIGS. 4 and 5, both the drain voltage V3 of the P-channel MOS transistor 22 in the drive circuit 5 and the drain voltage V4 of the N-channel MOS transistor 23 in the drive circuit 6 are equal to the positive power supply voltage VDD. Therefore, the P-channel MOS transistor 7 is in its off state while the N-channel MOS transistor 8 is in its on state. As a result, the signal output terminal 2 is connected to the output terminal 43b of the operational amplifier 4, and is disconnected from the output terminal 43a of the operational amplifier 3.

In other words, when the voltage of the input signal applied to the signal input terminal 1 is in the range from 0 V to the given threshold voltage VTHN, the P-channel MOS transistor 22 in the drive circuit 5 is in its on state so that the gate voltage of the N-channel MOS transistor 8 is equal to about the positive power supply voltage VDD. Thus, the N-channel MOS transistor 8 is in its on state, and the signal output terminal 2 is connected to the output terminal 43b of the operational amplifier 4. On the other hand, the N-channel MOS transistor 23 in the drive circuit 6 is in its off state. Thus, the P-channel MOS transistor 24 which serves as a load resistor causes the gate voltage of the P-channel MOS transistor 7 to be equal to about the positive power supply voltage VDD. As a result, the P-channel MOS transistor 7 is in its off state, and the signal output terminal 2 is disconnected from the output terminal 43a of the operational amplifier 3.

Accordingly, when the voltage of the input signal applied to the signal input terminal 1 is in the range from 0 V to the given threshold voltage VTHN, the output voltage V2 of the operational amplifier 4 travels to the signal output terminal 2. The reason why the output voltage V1 of the operational amplifier 3 is equal to about the given threshold voltage VTHN is that the N-channel MOS transistors 49a and 50a are in their off states, and hence the P-channel MOS transistor 54a is also in its off state.

When the voltage of the input signal applied to the signal input terminal 1 is in the range from the given threshold voltage VDD−VTHP to the positive power supply voltage VDD, the operational amplifier 3 normally operates and the operational amplifier 4 remains inoperative. In this case, the output voltage V1 of the operational amplifier 3 is equal to the voltage of the input signal while the output voltage V2 of the operational amplifier 4 is equal to about the given threshold voltage VDD−VTHP. Thus, as shown in FIGS. 4 and 5, both the drain voltage V3 of the P-channel MOS transistor 22 in the drive circuit 5 and the drain voltage V4 of the N-channel MOS transistor 23 in the drive circuit 6 are equal to 0 V. Therefore, the P-channel MOS transistor 7 is in its on state while the N-channel MOS transistor 8 is in its off state. As a result, the signal output terminal 2 is connected to the output terminal 43*a* of the operational amplifier 3, and is disconnected from the output terminal 43*b* of the operational amplifier 4.

In other words, when the voltage of the input signal applied to the signal input terminal 1 is in the range from the given threshold voltage VDD–VTHP to the positive power supply voltage VDD, the N-channel MOS transistor 23 in the drive circuit 6 is in its on state so that the gate voltage of the P-channel MOS transistor 7 is equal to about 0 V. Thus, the P-channel MOS transistor 7 is in its on state, and the signal output terminal 2 is connected to the output terminal 43*a* of the operational amplifier 3. On the other hand, the P-channel MOS transistor 22 in the drive circuit 5 is in its off state. Thus, the N-channel MOS transistor 21 which serves as a load resistor causes the gate voltage of the N-channel MOS transistor 8 to be equal to about 0 V. As a result, the N-channel MOS transistor 8 is in its off state, and the signal output terminal 2 is disconnected from the output terminal 43*b* of the operational amplifier 4.

Accordingly, when the voltage of the input signal applied to the signal input terminal 1 is in the range from the given threshold voltage VDD–VTHP to the positive power supply voltage VDD, the output voltage V1 of the operational amplifier 3 travels to the signal output terminal 2. The reason why the output voltage V2 of the operational amplifier 4 is equal to about the given threshold voltage VDD–VTHP is that the P-channel MOS transistors 49*b* and 50*b* are in their off states, and hence the N-channel MOS transistor 54*b* is also in its off state.

When the voltage of the input signal applied to the signal input terminal 1 is in the range from the given threshold voltage VTHN to the given threshold voltage VDD–VTHP, both the operational amplifiers 3 and 4 normally operate. In this case, the output voltage V1 of the operational amplifier 3 and also the output voltage V2 of the operational amplifier 4 are equal to the voltage of the input signal. Thus, as shown in FIGS. 4 and 5, the drain voltage V3 of the P-channel MOS transistor 22 in the drive circuit 5 is equal to about the positive power supply voltage VDD while the drain voltage V4 of the N-channel MOS transistor 23 in the drive circuit 6 is to 0 V. Therefore, both the P-channel MOS transistor 7 and the N-channel MOS transistor 8 are in their on states. As a result, the signal output terminal 2 is connected to both the output terminal 43*a* of the operational amplifier 3 and the output terminal 43*b* of the operational amplifier 4.

In other words, when the voltage of the input signal applied to the signal input terminal 1 is in the range from the given threshold voltage VTHN to the given threshold voltage VDD–VTHP, both the P-channel MOS transistor 22 in the drive circuit 5 and the N-channel MOS transistor 23 in the drive circuit 6 are in their on states so that the gate voltage of the P-channel MOS transistor 7 is equal to about 0 V and the gate voltage of the N-channel MOS transistor 8 is equal to about the positive power supply voltage VDD. Thus, both the P-channel MOS transistor 7 and the N-channel MOS transistor 8 are in their on states, and the signal output terminal 2 is connected to both the output terminal 43*a* of the operational amplifier 3 and the output terminal 43*b* of the operational amplifier 4.

Accordingly, when the voltage of the input signal applied to the signal input terminal 1 is in the range from the given threshold voltage VTHN to the given threshold voltage VDD–VTHP, a voltage which appears at the signal output terminal 2 is determined by the output voltages V1 and V2 of the operational amplifier 3 and 4, and the on-state resistances of the P-channel MOS transistor 7 and the N-channel MOS transistor 8. In the case where offset voltages of the operational amplifiers 3 and 4 are null, the voltage at the signal output terminal 2 is equal to the voltage of the input signal.

As understood from the previous explanation, the buffer circuit of FIG. 1 normally responds to an input signal having a voltage in the full range, that is, the range from 0 V to the positive power supply voltage VDD. The buffer circuit of FIG. 1 outputs a rail-to-rail output signal in response to such a dc input voltage.

The buffer circuit of FIG. 1 includes the operational amplifiers 3 and 4. In the operational amplifier 3, the N-channel MOS transistors 49*a* and 50*a* are input transistors of a differential amplifier circuit. In the operational amplifier 4, the P-channel MOS transistors 49*b* and 50*b* are input transistors of a differential amplifier circuit. The operational amplifiers 3 and 4 are separate from and independent of each other. One of the output voltages V1 and V2 of the operational amplifiers 3 and 4 is selected in response to the voltage of an input signal to the buffer circuit. The selected output voltage is used as an output voltage from the buffer circuit. Accordingly, the buffer circuit of FIG. 1 generates a rail-to-rail output signal.

In the buffer circuit of FIG. 1, the P-channel MOS transistor 7 is connected between the signal output terminal 2 and the output terminal 43*a* of the operational amplifier 3. The operational amplifier 3 normally responds to an input voltage in the range from the given threshold voltage VTHN to the positive power supply voltage VDD. The drive circuit 6 sets the P-channel MOS transistor 7 in its on state when the voltage of an input signal is in the range from the given threshold voltage VTHN to the positive power supply voltage VDD. On the other hand, the N-channel MOS transistor 8 is connected between the signal output terminal 2 and the output terminal 43*b* of the operational amplifier 4. The operational amplifier 4 normally responds to an input voltage in the range from 0 V to the given threshold voltage VDD–VTHP. The drive circuit 5 sets the N-channel MOS transistor 8 in its on state when the voltage of an input signal is in the range from 0 V to the given threshold voltage VDD–VTHP. This design can simplify the circuit structure.

It should be noted that the-gate of the P-channel MOS transistor 22 in the drive circuit 5 and the gate of the N-channel MOS transistor 23 in the drive circuit 6 may be directly connected to the signal input terminal 1 rather than the output terminals 43*a* and 43*b* of the operational amplifiers 3 and 4.

Second Embodiment

Figure 6:
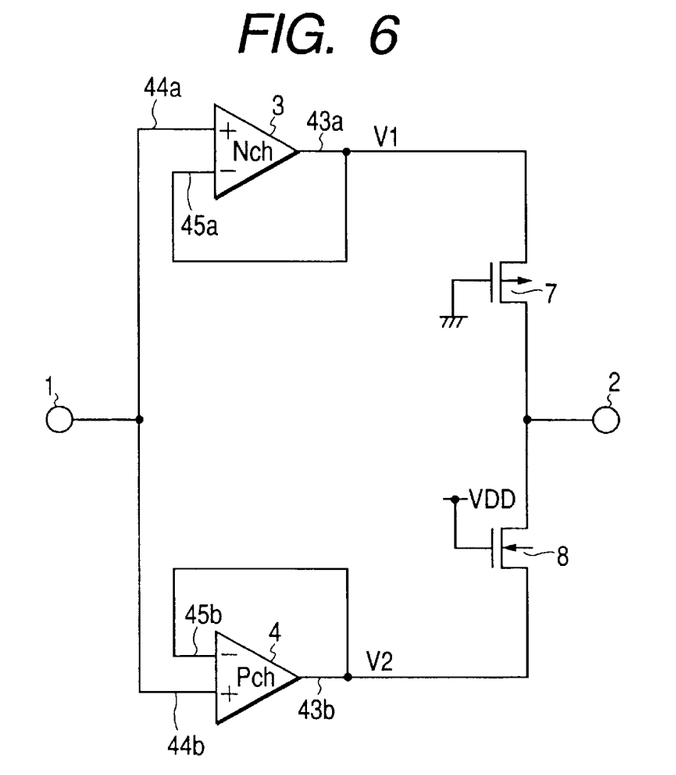
FIG. 6 is a diagram of a buffer circuit according to a second embodiment of this invention.

FIG. 6 shows a buffer circuit according to a second embodiment of this invention. The buffer circuit of FIG. 6 is similar to the buffer circuit of FIG. 1 except for the following design changes. The drive circuits 5 and 6 (see FIG. 1) are omitted from the buffer circuit of FIG. 6. In the buffer circuit of FIG. 6, the gate of the P-channel MOS transistor 7 is connected to the ground line, being subjected to the ground voltage GND. On the other hand, the gate of the N-channel MOS transistor 8 is connected to the positive power supply line, being subjected to the positive power supply voltage VDD.

In the buffer circuit of FIG. 6, the operational amplifier 3 can normally respond to an input voltage which is in the range from about the given threshold voltage VTHN to the positive power supply voltage VDD. The operational amplifier 4 can normally respond to an input voltage which is in the range from 0 V (the ground voltage GND) to about the given threshold voltage VDD–VTHP.

The conductance (GDS) between the drain and the source of the P-channel MOS transistor 7 corresponds to the reciprocal of the on-state resistance of the P-channel MOS transistor 7. Similarly, the conductance (GDS) between the drain and the source of the N-channel MOS transistor 8 corresponds to the reciprocal of the on-state resistance of the N-channel MOS transistor 8.

Figure 7:
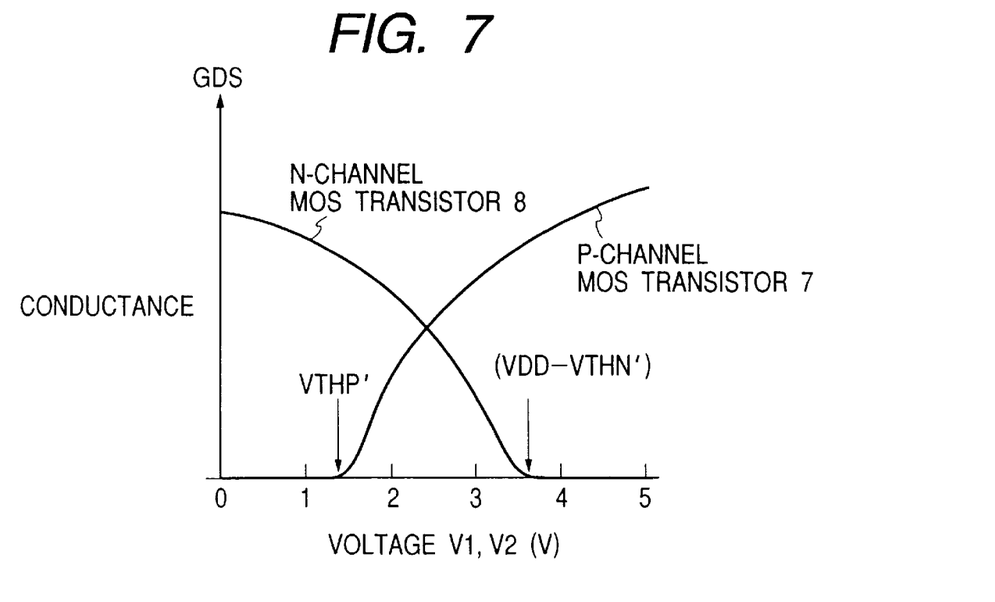
FIG. 7 is a diagram of the relation between an output voltage V1 of a first operational amplifier and a conductance (GDS) between the drain and the source of a P-channel MOS transistor, and the relation between an output voltage V2 of a second operational amplifier and a conductance (GDS) between the drain and the source of an N-channel MOS transistor in FIG. 6.

As shown in FIG. 7, the conductance (GDS) of the N-channel MOS transistor 8 is maximal when the output voltage V2 of the operational amplifier 4 (the source voltage V2 of the N-channel MOS transistor 8) is equal to 0 V. The conductance (GDS) of the N-channel MOS transistor 8 decreases as the output voltage V2 of the operational amplifier 4 rises from 0 V. The conductance (GDS) of the N-channel MOS transistor 8 becomes substantially null when the output voltage V2 of the operational amplifier 4 reaches a prescribed voltage VDD–VTHN'. The prescribed voltage VDD–VTHN' is lower than the positive power supply voltage VDD minus the given threshold voltage VTHN, that is, "VDD–VTHN".

As shown in FIG. 7, the conductance (GDS) of the P-channel MOS transistor 7 is maximal when the output voltage V1 of the operational amplifier 3 (the source voltage V1 of the P-channel MOS transistor 7) is equal to the positive power supply voltage VDD (+5 V). The conductance (GDS) of the P-channel MOS transistor 7 decreases as the output voltage V1 of the operational amplifier 3 drops from the positive power supply voltage VDD (+5 V). The conductance (GDS) of the P-channel MOS transistor 7 becomes substantially null when the output voltage V1 of the operational amplifier 3 reaches a prescribed voltage VTHP'. The prescribed voltage VTHP' is higher than the given voltage VTHP.

If the source voltage of the P-channel MOS transistor 7 is exactly equal to the positive power supply voltage VDD, the P-channel MOS transistor 7 has the given threshold voltage VTHP. The substrate effect causes the source voltage of the P-channel MOS transistor 7 to deviate from the positive power supply voltage VDD. This deviation increases the threshold voltage of the P-channel MOS transistor 7 from the value VTHP to the value VTHP'.

If the source voltage of the N-channel MOS transistor 8 is exactly equal to 0 V (the ground voltage GND), the N-channel MOS transistor 8 has the given threshold voltage VTHN. The substrate effect causes the source voltage of the N-channel MOS transistor 8 to deviate from 0 V. This deviation increases the threshold voltage of the N-channel MOS transistor 8 from the value VTHN to the value VTHN'.

The previously-indicated difference in GDS characteristic between the P-channel MOS transistor 7 and the N-channel MOS transistor 8 (the output transistors) is used in suitably switching the P-channel MOS transistor 7 and the N-channel MOS transistor 8. Specifically, in the case where VTHN<VTHP' and VTHP<VTHN', the conductance of one of the output transistors 7 and 8 is significantly smaller than the conductance of the other output transistor. Thus, one of the output transistors 7 and 8 is in its off state while the other output transistor is in its on state. It is preferable to equalize the threshold voltages VTHP and VTHN.

Third Embodiment

Figure 8:
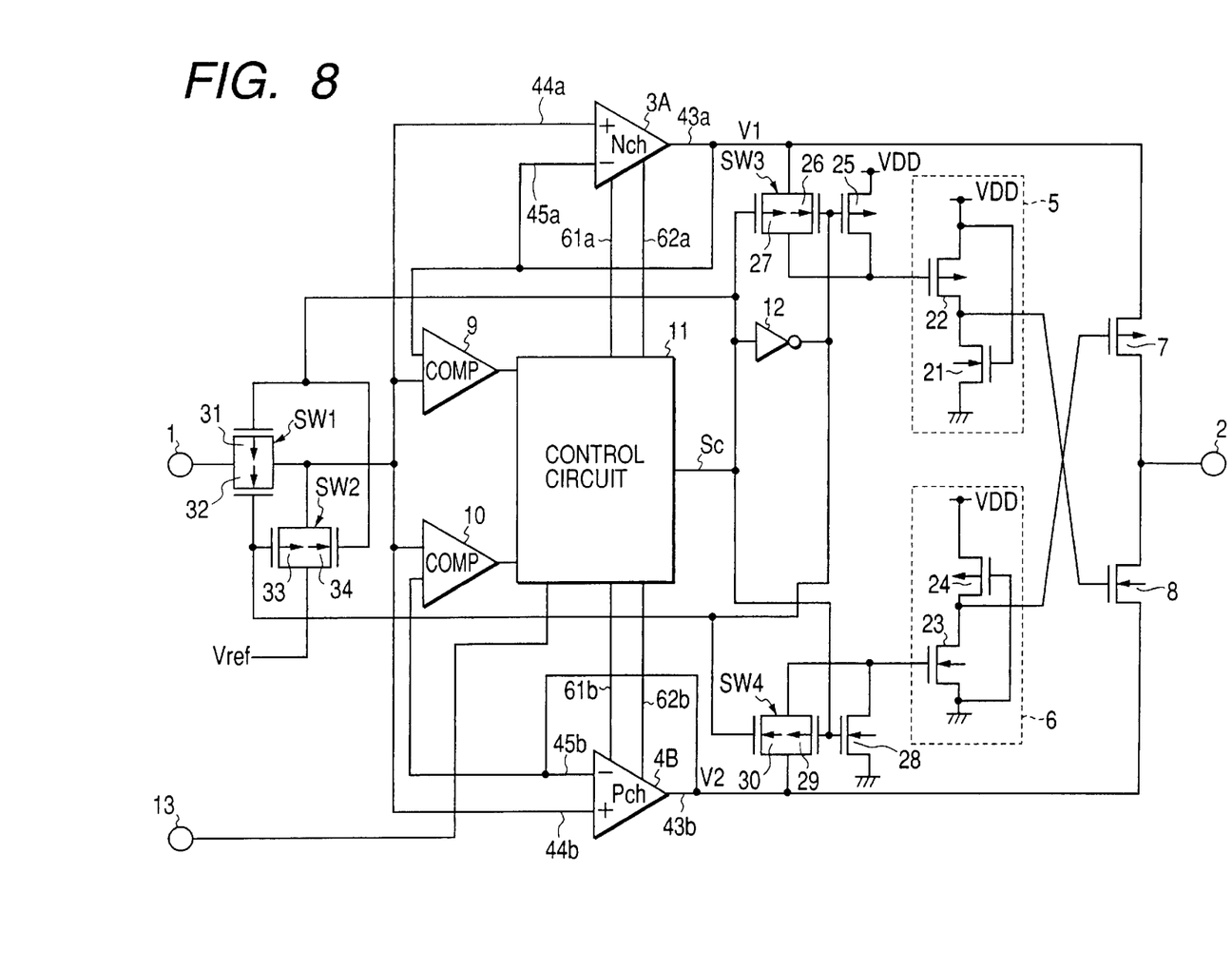
FIG. 8 is a diagram of a buffer circuit according to a third embodiment of this invention.

FIG. 8 shows a buffer circuit according to a third embodiment of this invention. The buffer circuit of FIG. 8 is similar to the buffer circuit of FIG. 1 except for design changes explained hereinafter. The buffer circuit of FIG. 8 includes operational amplifiers 3A and 4B instead of the operational amplifiers 3 and 4 (see FIG. 1) respectively.

Figure 9:
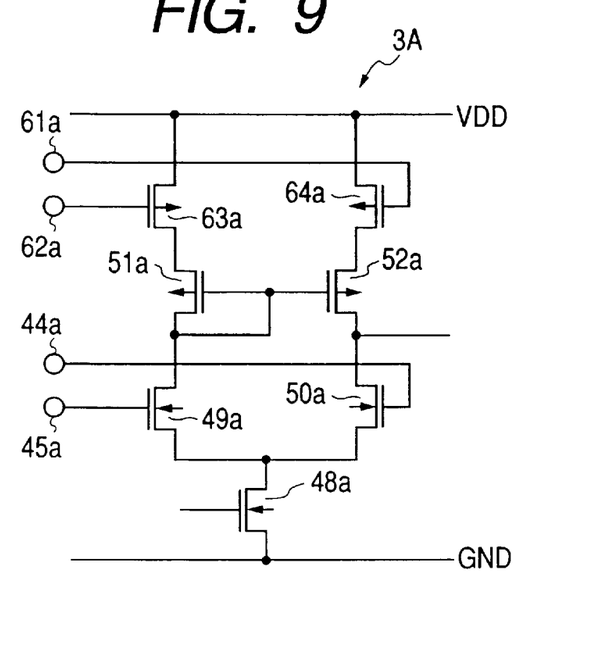
FIG. 9 is a schematic diagram of a differential amplifier circuit of a first operational amplifier in FIG. 8.

As shown in FIG. 9, the operational amplifier 3A includes P-channel MOS transistors 63a and 64a. The P-channel MOS transistor 63a is interposed between the positive power supply line and the P-channel MOS transistor 51a. Specifically, the source of the P-channel MOS transistor 63a is connected to the positive power supply line, being subjected to the positive power supply voltage VDD (+5 V). The drain of the P-channel MOS transistor 63a is connected to the source of the P-channel MOS transistor 51a. On the other hand, the P-channel MOS transistor 64a is interposed between the positive power supply line and the P-channel MOS transistor 52a. Specifically, the source of the P-channel MOS transistor 64a is connected to the positive power supply line, being subjected to the positive power supply voltage VDD (+5 V). The drain of the P-channel MOS transistor 64a is connected to the source of the P-channel MOS transistor 52a. The P-channel MOS transistors 63a and 64a are used for offset correction. The gate of the P-channel MOS transistor 64a is connected to an offset adjustment terminal 61a. The gate of the P-channel MOS transistor 63a is connected to an offset adjustment terminal 62a. As voltages (offset corrective voltages) at the gates of the P-channel MOS transistors 63a and 64a are varied, the balancing condition of the operation of the related differential amplifier circuit changes so that an output voltage of the operational amplifier 3A varies.

Figure 10:
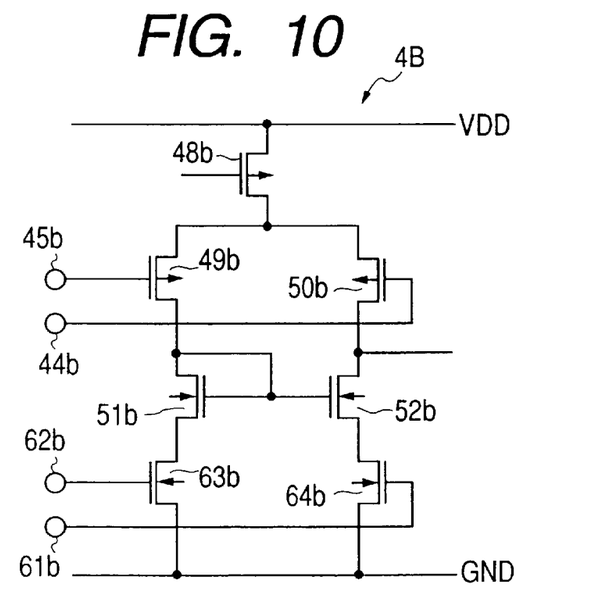
FIG. 10 is a schematic diagram of a differential amplifier circuit of a second operational amplifier in FIG. 8.

As shown in FIG. 10, the operational amplifier 4B includes N-channel MOS transistors 63b and 64b. The N-channel MOS transistor 63b is interposed between the ground line and the N-channel MOS transistor 51b. Specifically, the source of the N-channel MOS transistor 63b is connected to the ground line, being subjected to the ground voltage GND (0 V). The drain of the N-channel MOS transistor 63b is connected to the source of the N-channel MOS transistor 51b. On the other hand, the N-channel MOS transistor 64b is interposed between the ground line and the N-channel MOS transistor 52b. Specifically, the source of the N-channel MOS transistor 64b is connected to the ground line, being subjected to the ground voltage GND (0 V). The drain of the N-channel MOS transistor 64b is connected to the source of the N-channel MOS transistor 52b. The N-channel MOS transistors 63b and 64b are used for offset correction. The gate of the N-channel MOS transistor 64b is connected to an offset adjustment terminal 61b. The gate of the N-channel MOS transistor 63b is connected to an offset adjustment terminal 62b. As voltages (offset corrective voltages) at the gates of the N-channel MOS transistors 63b and 64b are varied, the balancing condition of the operation of the related differential amplifier circuit changes so that an output voltage of the operational amplifier 4B varies.

The buffer circuit of FIG. 8 includes analog switches SW1, SW2, SW3, SW4, a P-channel MOS transistor 25, an N-channel MOS transistor 28, and comparators 9 and 10. The analog switch SW1 is interposed between the signal input terminal 1 and the non-inverting input terminals 44a and 44b of the operational amplifiers 3A and 4B. The analog switch SW1 has a combination of a P-channel MOS transistor 31 and an N-channel MOS transistor 32. A first end of the analog switch SW2 is subjected to a prescribed reference voltage Vref in the range from the given threshold voltage VTHN to the given threshold voltage VDD–VTHP. The prescribed reference voltage Vref is equal to, for example, 2.5 V. A second end of the analog switch SW2 is connected to the non-inverting input terminals 44a and 44b of the operational amplifiers 3A and 4B. The analog switch SW2 has a combination of a P-channel MOS transistor 33 and an N-channel MOS transistor 34. The analog switch SW3 is interposed between the output terminal 43a of the operational amplifier 3A and the gate of the P-channel MOS transistor 22. The analog switch SW3 has a combination of a P-channel MOS transistor 27 and an N-channel MOS transistor 26. The source of the P-channel MOS transistor 25 is connected to the positive power supply line, being subjected to the positive power supply voltage VDD (+5 V). The drain of the P-channel MOS transistor 25 is connected to the gate of the P-channel MOS transistor 22. The analog switch SW4 is interposed between the output terminal 43b of the operational amplifier 4B and the gate of the N-channel MOS transistor 23. The analog switch SW4 has a combination of a P-channel MOS transistor 29 and an N-channel MOS transistor 30. The source of the N-channel MOS transistor 28 is connected to the ground line, being subjected to the ground voltage GND (0 V). The drain of the N-channel MOS transistor 28 is connected to the gate of the N-channel MOS transistor 23. A first input terminal of the comparator 9 is connected to the non-inverting input-terminal 44a of the operational amplifier 3A. A second input terminal of the comparator 9 is connected to the output terminal 43a of the operational amplifier 3A. The device 9 compares the voltage at the non-inverting input terminal 44a of the operational amplifier 3A and the output voltage V1 of the operational amplifier 3A. A first input terminal of the comparator 10 is connected to the non-inverting input terminal 44b of the operational amplifier 4B. A second input terminal of the comparator 10 is connected to the output terminal 43b of the operational amplifier 4B. The device 10 compares the voltage at the non-inverting input terminal 44b of the operational amplifier 4B and the output voltage V2 of the operational amplifier 4B.

The buffer circuit of FIG. 8 further includes a control circuit 11 and an inverter 12. The control circuit 11 is connected to an input terminal 13 for a correction start signal. Also, the control circuit 11 is connected to the output terminals of the comparators 9 and 10, the offset adjustment terminals 61a and 62a of the operational amplifier 3A, and the offset adjustment terminals 61b and 62b of the operational amplifier 4B. In addition, the control circuit 11 is connected to the input terminal of the inverter 12, the gate of the N-channel MOS transistor 28, and first control terminals of the analog switches SW1, SW3, and SW4. The output terminal of the inverter 12 is connected to the gate of the P-channel MOS transistor 25. Also, the output terminal of the inverter 12 is connected to second control terminals of the analog switches SW1, SW3, and SW4. A first control terminal of the analog switch SW2 is connected to the output terminal of the inverter 12. A second control terminal of the analog switch SW2 is connected to the control circuit 11.

The control circuit 11 includes, for example, a microcomputer having a combination of an input/output port, a CPU, a ROM, and a RAM. The control circuit 11 operates in accordance with a program stored in the ROM. The program is designed to implement the following processes. The control circuit 11 generates a switch control signal Sc in response to the correction start signal which is fed via the input terminal 13. The control circuit 11 outputs the switch control signal Sc to the analog switches SW1, SW2, SW3, and SW4, the inverter 12, and the gate of the N-channel MOS transistor 28. When the correction start signal is in its high-level state (its active state), the switch control signal Sc is in its high-level state. In this case, the control circuit 11 implements signal processing for determining desired offset corrective voltages which enable offset voltages in the operational amplifiers 3A and 4B to be completely canceled. When the correction start signal is in its low-level state (its inactive state), the switch control signal Sc is in its low-level state. The device 12 inverts the switch control signal Sc. The inverter 12 outputs the inversion-resultant signal to the analog switches SW1, SW2, SW3, and SW4, and the gate of the P-channel MOS transistor 25.

When the correction start signal is changed to its high-level state (its active state), the switch control signal Sc outputted from the control circuit 11 changes from its low-level state to its high-level state. The analog switch SW1 falls into its off state (its open state) in response to the low-to-high change of the switch control signal Sc. Thus, the non-inverting input terminals 44a and 44b of the operational amplifiers 3A and 4B are disconnected from the signal input terminal 1. The analog switch SW2 moves to its on state (its closed state) in response to the low-to-high change of the switch control signal Sc. Thus, the prescribed reference voltage Vref is applied to the non-inverting input terminals 44a and 44b of the operational amplifiers 3A and 4B.

The analog switch SW3 falls into its off state (its open state) in response to the low-to-high change of the switch control signal Sc. Thus, the gate of the P-channel MOS transistor 22 is disconnected from the output terminal 43a of the operational amplifier 3A. The output signal of the inverter 12 assumes its low-level state in response to the low-to-high change of the switch control signal Sc. The P-channel MOS transistor 25 moves to its on state in response to the high-to-low change of the output signal of the inverter 12. Thus, the positive power supply voltage VDD is applied to the gate of the P-channel MOS transistor 22. As a result, the N-channel MOS transistor 8 falls into its off state.

The analog switch SW4 falls into its off state (its open state) in response to the low-to-high change of the switch control signal Sc. Thus, the gate of the N-channel MOS transistor 23 is disconnected from the output terminal 43b of the operational amplifier 4B. The N-channel MOS transistor 28 moves to its on state in response to the low-to-high change of the switch control signal Sc. Thus, the ground voltage GND is applied to the gate of the N-channel MOS transistor 23. As a result, the P-channel MOS transistor 7 falls into its off state.

The control circuit 11 holds the switch control signal Sc in its high-level state for a time interval during which the control circuit 11 determines desired offset corrective voltages to cancel offset voltages in the operational amplifiers 3A and 4B. Specifically, the control circuit 11 generates offset corrective voltages, and applies the generated offset corrective voltages to the offset adjustment terminals 61a and 62a of the operational amplifier 3A respectively. The control circuit 11 adjusts the offset corrective voltages, that is, the gate voltages of the P-channel MOS transistors 63a and 64a (see FIG. 9), to cancel the offset voltage in the operational amplifier 3A. In addition, the control circuit 11 generates offset corrective voltages, and applies the generated offset corrective voltages to the offset adjustment terminals 61b and 62b of the operational amplifier 4B respectively. The control circuit 11 adjusts the offset corrective voltages, that is, the gate voltages of the N-channel MOS transistors 63b and 64b (see FIG. 10), to cancel the offset voltage in the operational amplifier 4B.

In more detail, the control circuit 11 sets the offset corrective voltages for the operational amplifier 3A to 0 V to minimize the on-state resistances of the P-channel MOS transistors 63a and 64a. Then, the control circuit 11 gradually increases one of the offset corrective voltages until the output signal of the comparator 9 changes in its logic state, that is, until the output voltage V1 of the operational amplifier 3A reaches the prescribed reference voltage Vref and hence the offset voltage therein is completely canceled. The control circuit 11 stops increasing one of the offset corrective voltages when the output signal of the comparator 9 changes in its logic state. The control circuit 11 samples and holds the offset corrective voltages which occur upon the logic-state change of the output signal of the comparator 9. The sampled and held offset corrective voltages are used as desired offset corrective voltages. During a subsequent period of time, the control circuit 11 continues 1 10 to output the desired offset corrective voltages to the offset adjustment terminals 61a and 62a of the operational amplifier 3A respectively.

On the other hand, the control circuit 11 sets the offset corrective voltages for the operational amplifier 4B to the positive power supply voltage VDD to minimize the on-state resistances of the N-channel MOS transistors 63b and 64b. Then, the control circuit 11 gradually decreases one of the offset corrective voltages until the output signal of the comparator 10 changes in its logic state, that is, until the output voltage V2 of the operational amplifier 4B reaches the prescribed reference voltage Vref and hence the offset voltage therein is completely canceled. The control circuit 11 stops decreasing one of the offset corrective voltages when the output signal of the comparator 10 changes in its logic state. The control circuit 11 samples and holds the offset corrective voltages which occur upon the logic-state change of the output signal of the comparator 10. The sampled and held offset corrective voltages are used as desired offset corrective voltages. During a subsequent period of time, the control circuit 11 continues to output the desired offset corrective voltages to the offset adjustment terminals 61b and 62b of the operational amplifier 4B respectively.

When the correction start signal is returned to its low-level state (its inactive state), the switch control signal Sc outputted from the control circuit 11 changes from its high-level state to its low-level state. The analog switch SW1 moves to its on state (its closed state) in response to the high-to-low change of the switch control signal Sc. Thus, the non-inverting input terminals 44a and 44b of the operational amplifiers 3A and 4B are connected to the signal input terminal 1. The analog switch SW2 falls into its off state (its open state) in response to the high-to-low change of the switch control signal Sc. Thus, the prescribed reference voltage Vref is inhibited from being applied to the non-inverting input terminals 44a and 44b of the operational amplifiers 3A and 4B.

The analog switch SW3 moves to its on state (its closed state) in response to the high-to-low change of the switch control signal Sc. Thus, the gate of the P-channel MOS transistor 22 is connected to the output terminal 43a of the operational amplifier 3A. The output signal of the inverter 12 assumes its high-level state in response to the high-to-low change of the switch control signal Sc. The P-channel MOS transistor 25 falls into its off state in response to the low-to-high change of the output signal of the inverter 12. Thus, the positive power supply voltage VDD is inhibited from being applied to the gate of the P-channel MOS transistor 22.

The analog switch SW4 moves to its on state (its closed state) in response to the high-to-low change of the switch control signal Sc. Thus, the gate of the N-channel MOS transistor 23 is connected to the output terminal 43b of the operational amplifier 4B. The N-channel MOS transistor 28 falls into its off state in response to the high-to-low change of the switch control signal Sc. Thus, the ground voltage GND is inhibited from being applied to the gate of the N-channel MOS transistor 23.

As previously explained, when the correction start signal applied to the input terminal 13 is changed to its high-level state, the control circuit 11 operates to determine the desired offset corrective voltages for the operational amplifiers 3A and 4B. The correction start signal is returned to its low-level state after the determination of the desired offset corrective voltages is completed. During a subsequent period of time, the correction start signal remains in its low-level state, and the control circuit 11 continues to output the desired offset corrective voltages to the operational amplifiers 3A and 4B. In this case, the buffer circuit of FIG. 8 responds to an input signal fed via the signal input terminal 1 while the offset voltages in the operational amplifiers 3A and 4B remain corrected or removed.

What is claimed is:

1. A buffer circuit comprising:
   a signal input terminal;
   a signal output terminal;
   a first operational amplifier including a differential amplifier circuit having an input transistor of an N-channel MOS type, the first operational amplifier having an inverting input terminal and an output terminal connected to each other, the first operational amplifier having a non-inverting input terminal connected to the signal input terminal;
   a second operational amplifier including a differential amplifier circuit having an input transistor of a P-channel MOS type, the second operational amplifier having an inverting input terminal and an output terminal connected to each other, the second operational amplifier having a non-inverting input terminal connected to the signal input terminal;
   first switching means for connecting the output terminal of the first operational amplifier to the signal output terminal when a voltage of an input signal applied to the signal input terminal is in a range where the first operational amplifier is operative; and
   second switching means for connecting the output terminal of the second operational amplifier to the signal output terminal when the voltage of the input signal applied to the signal input terminal is in a range where the second operational amplifier is operative.

2. A buffer circuit as recited in claim 1, wherein the first switching means comprises:
   a first output transistor having a first output terminal connected to the output terminal of the first operational amplifier, and a second output terminal connected to the signal output terminal; and
   first drive means for setting the first output transistor in its on state when the voltage of the input signal applied to the signal input terminal is in the range where the first operational amplifier is operative; and
   wherein the second switching means comprises:
      a second output transistor having a first output terminal connected to the output terminal of the second operational amplifier, and a second output terminal connected to the signal output terminal; and
      second drive means for setting the second output transistor in its on state when the voltage of the input signal applied to the signal input terminal is in the range where the second operational amplifier is operative.

3. A buffer circuit as recited in claim 2, wherein the first output transistor comprises a P-channel MOS transistor having a source connected to the output terminal of the first operational amplifier, and a drain connected to the signal output terminal;

wherein the second output transistor comprises an N-channel MOS transistor having a source connected to the output terminal of the second operational amplifier, and a drain connected to the signal output terminal;

wherein the first drive means comprises:
an N-channel MOS transistor having a gate connected to the output terminal of the second operational amplifier or the signal input terminal, a source connected to a lower voltage side of a dc voltage, and a drain connected to a gate of the first output transistor; and
a first load resistor connected between the drain of the N-channel MOS transistor in the first drive means and a higher voltage side of the dc voltage; and wherein the second drive means comprises:
a P-channel MOS transistor having a gate connected to the output terminal of the first operational amplifier or the signal input terminal, a source connected to the higher voltage side of the dc voltage, and a drain connected to a gate of the second output transistor; and
a second load resistor connected between the drain of the P-channel MOS transistor in the second drive means and the lower voltage side of the dc voltage.

4. A buffer circuit as recited in claim 1, further comprising:

first adjusting means provided in the differential amplifier circuit in the first operational amplifier for adjusting an output voltage of the first operational amplifier in response to a first control voltage;

second adjusting means provided in the differential amplifier circuit in the second operational amplifier for adjusting an output voltage of the second operational amplifier in response to a second control voltage;

reference voltage applying means for applying a prescribed reference voltage to the non-inverting input terminal of the first operational amplifier and the non-inverting input terminal of the second operational amplifier; and offset correcting means for, in cases where the reference voltage applying means continues to apply the prescribed reference voltage to the non-inverting input terminal of the first operational amplifier and the non-inverting input terminal of the second operational amplifier, 1) varying the first control voltage to the first adjusting means, 2) stopping varying the first control voltage when the output voltage of the first operational amplifier becomes equal to the prescribed reference voltage, 3) varying the second control voltage to the second operational amplifier, and 4) stopping varying the second control voltage when the output voltage of the second operational amplifier becomes equal to the prescribed reference voltage.

5. A buffer circuit as recited in claim 1, wherein the first switching means comprises a first output transistor having a first output terminal connected to the output terminal of the first operational amplifier, and a second output terminal connected to the signal output terminal;

wherein the second switching means comprises a second output transistor having a first output terminal connected to the output terminal of the second operational amplifier, and a second output terminal connected to the signal output terminal; and wherein threshold voltages of the first and second output transistors are different from threshold voltages of transistors in the first and second operational amplifiers.

6. A buffer circuit as recited in claim 1, wherein the first switching means comprises a P-channel MOS transistor having a source connected to the output terminal of the first operational amplifier, a drain connected to the signal output terminal, and a gate subjected to a first fixed potential; and wherein the second switching means comprises an N-channel MOS transistor having a source connected to the output terminal of the second operational amplifier, a drain connected to the signal output terminal, and a gate subjected to a second fixed potential different from the first fixed potential.

* * * * *